United States Patent
Moore et al.

(10) Patent No.: US 9,573,243 B2
(45) Date of Patent: Feb. 21, 2017

(54) METHOD FOR ADAPTIVE FEEDBACK CONTROLLED POLISHING

(71) Applicant: Headway Technologies, Inc., Milpitas, CA (US)

(72) Inventors: Terry Moore, Mountain View, CA (US); Brant Nease, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/532,338

(22) Filed: Nov. 4, 2014

(65) Prior Publication Data

US 2016/0121451 A1    May 5, 2016

(51) Int. Cl.

| | | |
|---|---|---|
| *C03C 15/00* | (2006.01) | |
| *C03C 25/68* | (2006.01) | |
| *H01L 21/302* | (2006.01) | |
| *H01L 21/461* | (2006.01) | |
| *H01L 21/311* | (2006.01) | |
| *B24B 37/013* | (2012.01) | |
| *B24B 49/12* | (2006.01) | |
| *H01L 21/321* | (2006.01) | |

(Continued)

(52) U.S. Cl.
CPC ............ *B24B 37/013* (2013.01); *B24B 49/12* (2013.01); *H01L 21/302* (2013.01); *H01L 21/31053* (2013.01); *H01L 21/3212* (2013.01); *H01L 22/12* (2013.01); *H01L 22/26* (2013.01); *B81C 99/0065* (2013.01); *B81C 2201/0104* (2013.01)

(58) Field of Classification Search
None
See application file for complete search history.

(56) References Cited

U.S. PATENT DOCUMENTS

| | | | |
|---|---|---|---|
| 5,872,633 A | | 2/1999 | Holzapfel et al. |
| 6,051,496 A | * | 4/2000 | Jang .................... H01L 21/3212 |
| | | | 257/E21.304 |

(Continued)

FOREIGN PATENT DOCUMENTS

| | | |
|---|---|---|
| WO | WO 98/05066 | 2/1998 |
| WO | WO 2012/148716 | 11/2012 |

OTHER PUBLICATIONS

PCT Search Report, Feb. 17, 2016, Headway Technologies, Inc., PCT/US2015/056311.

*Primary Examiner* — Stephanie Duclair
(74) *Attorney, Agent, or Firm* — Saile Ackerman LLC; Stephen B. Ackerman (57) ABSTRACT

An adaptive feedback control method is provided for a chemical mechanical polish process to minimize a dielectric layer clearing time difference between two annular regions on a substrate. An optical system with an optical window passes below the polishing pad and detects reflected light interference signals from at least two annular regions. A pre-clearing time difference is determined and is used to calculate an adjustment to one or both of a CMP head membrane pressure and a retaining ring pressure. The pressure adjustment is applied before the end of the polish cycle to avoid the need for a second polish cycle and to reduce a dishing difference and a resistance difference in a metal layer in the at least two annular regions. In some embodiments, a second pressure adjustment is performed before the end of the cycle and different CMP head membrane pressure adjustments are made in different pressure zones.

20 Claims, 11 Drawing Sheets

(51) Int. Cl.
*H01L 21/3105* (2006.01)
*H01L 21/66* (2006.01)
*B81C 99/00* (2010.01)

(56) References Cited

U.S. PATENT DOCUMENTS

| | | |
|---|---|---|
| 6,234,870 B1 | 5/2001 | Uzoh et al. |
| 7,247,080 B1 | 7/2007 | Bennett et al. |
| 7,722,436 B2 | 5/2010 | Guthrie et al. |
| 8,357,286 B1 | 1/2013 | Molnar |
| 8,628,376 B2 | 1/2014 | Sin et al. |
| 2010/0056023 A1* | 3/2010 | David ............... B24B 37/005 451/5 |
| 2010/0129939 A1 | 5/2010 | David et al. |
| 2012/0276815 A1 | 11/2012 | David et al. |
| 2013/0224890 A1* | 8/2013 | Xu ..................... H01L 22/26 438/8 |

* cited by examiner

Table 1

| Pre-clearing time difference | Wafer backside pressure | Retaining ring pressure |
|---|---|---|
| −4 units | MP − x1 psi | RRP − y1 psi |
| −3 units | MP − x2 psi | RRP − y2 psi |
| −2 units | MP − x3 psi | RRP − y3 psi |
| −1 unit | MP − x4 psi | RRP − y4 psi |
| 0 units | MP − 0 psi | RRP − 0 psi |
| +1 unit | MP + x5 psi | RRP + y5 psi |
| +2 units | MP + x6 psi | RRP + y6 psi |
| +3 units | MP + x7 psi | RRP + y7 psi |
| +4 units | MP + x8 psi | RRP + y8 psi |

| Pre-clearing time difference | Retaining ring pressure adj. | MP zone 1 pressure adj. | MP zone 2 pressure adj. | MP zone 3 pressure adj. | MP zone 4 pressure adj. |
|---|---|---|---|---|---|
| -4 units | RRP - y1 psi | MP - x1 psi | MP - v1 psi | MP - w1 psi | MP - z1 psi |
| -3 units | RRP - y2 psi | MP - x2 psi | MP - v2 psi | MP - w2 psi | MP - z2 psi |
| -2 units | RRP - y3 psi | MP - x3 psi | MP - v3 psi | MP - w3 psi | MP - z3 psi |
| -1 unit | RRP - y4 psi | MP - x4 psi | MP - v4 psi | MP - w4 psi | MP - z4 psi |
| 0 units | RRP - 0 psi | MP - 0 psi | MP - 0 psi | MP - 0 psi | MP - 0 psi |
| +1 unit | RRP + y5 psi | MP + x5 psi | MP + v5 psi | MP + w5 psi | MP + z5 psi |
| +2 units | RRP + y6 psi | MP + x6 psi | MP + v6 psi | MP + w6 psi | MP + z6 psi |
| +3 units | RRP + y7 psi | MP + x7 psi | MP + v7 psi | MP + w7 psi | MP + z7 psi |
| +4 units | RRP + y8 psi | MP + x8 psi | MP + v8 psi | MP + w8 psi | MP + z8 psi |

| | Center to edge dishing diff. in um (n=139wfs) | Center to edge resistance difference in ohms (n=111wfs) | Resistance difference std. deviation (n=111wfs) |
|---|---|---|---|
| POR AVG | −0.005 | 0.805 | 1.905 |
| POR WtW | 0.006 | 1.805 | 0.369 |
| AEP AVG (pred) | 0.005 | −0.107 | 1.686 |
| AEP WtW (pred) | 0.005 | 1.328 | 0.312 |
| | | | |
| WtW IMPROVEMENT | 20% | 26% | 16% |
| WiW IMPROVEMENT | N/A | 0.7Ω Clsr to 0 | 11% |

FIG. 14

METHOD FOR ADAPTIVE FEEDBACK CONTROLLED POLISHING

TECHNICAL FIELD

The present disclosure relates to a chemical mechanical polish (CMP) process, and in particular to a method that includes monitoring film thickness in a plurality of annular regions on a substrate, and adjusting one or both of a retaining ring pressure and backside pressure during the CMP process such that a difference in clearing times among the annular regions at the completion of the CMP process is substantially minimized to optimize film uniformity across the substrate.

BACKGROUND

CMP is a process of removing unwanted conductive or dielectric materials from a substrate by the application of chemical and mechanical forces. For example, during a damascene process, a metal such as Cu is deposited in openings within a dielectric layer. However, excess metal is deposited and must be removed with portions of dielectric material so that a top surface of the dielectric layer becomes coplanar with a top surface of the new metal layer.

A CMP tool is typically comprised of a polishing station with a rotatable platen on which a polishing pad is affixed. A substrate having a front side with one or more layers to be planarized has a backside that is held to a head piece by a vacuum during loading/unloading and by a retaining ring during polishing. After the substrate's front side is brought into contact with the polishing pad, a slurry is introduced and includes a chemical component such as an aqueous base or aqueous acid, and abrasive particles. As the polishing pad is rotated in one direction, the substrate typically rotates in the same direction, and the slurry effectively etches and abrades away a portion of the uppermost layer or layers on the substrate. During a polishing cycle, end point signals from an optical detection system may be analyzed either in real time or off-line to determine the end of the polishing cycle. Moreover, metrology measurements may be taken at the end of a cycle to indicate a final non-uniformity of film thickness across each wafer and may be used to adjust the polish process in subsequent polish cycles.

In some cases, CMP processes require a second polishing cycle where the wafer is reloaded into a CMP tool and non-uniformity thickness data from the initial polish cycle is used to determine backside pressures applied to the wafer in the second polish cycle with the aim of improving the final thickness non-uniformity. Sometimes a second polish is not possible due to a situation where final thickness constraints have already been met after the initial polish. In other words, further polishing of the thicker regions on the substrate cannot occur since the thinner regions that are already at the minimum thickness specification would also be thinned. Therefore, a CMP process that enables pressure adjustments during a single polish cycle is needed to minimize the difference between clearing times between different annual regions at the end of the polish cycle which reduces process time and improves film thickness uniformity across the substrate thereby increasing product yield.

SUMMARY

One objective of the present disclosure is to provide a CMP polishing method wherein a pressure adjustment is made to a CMP head membrane and/or to a retaining ring during a polish process such that a single polish cycle is sufficient to achieve acceptable film thickness non-uniformity.

A second objective of the present disclosure is provide a method according to the first objective that does not lengthen the polish process time compared with a method where no in-situ pressure adjustment is performed.

These objectives are achieved with a CMP process design according to one embodiment wherein incident light from an optical endpoint window moving underneath a wafer front side during a polish process passes through a dielectric layer and reflects off a metal etch stop layer that is adjacent to the metal layer to be planarized. Reflected light from the etch stop layer and dielectric layer form a light interference signal that is collected by a detector which is positioned below the polishing pad and platen. During the CMP process, the dielectric layer and an adjacent metal layer are thinned by the abrasive action of the slurry and pad, and due in part to etching by the chemical component in the slurry. Polishing yields a planar surface where the metal layer becomes coplanar with one or both of the dielectric layer and the etch stop layer. During the polish process, at least one so-called C3 delta measurement is taken from light interference signals reflected off the etch stop layer and dielectric layer at two or more annular regions on the substrate. For example, at time t1, a light interference signal from an outer annular region is detected and analyzed by a computer (CPU) that is linked to the detector and CMP controller. The light interference signal is used to calculate a phase difference that can then be translated to a thickness for the dielectric layer in an area in the annular region where the reflected light originated. Likewise, at time t2, a second light interference signal from a center annular region is detected and analyzed by the CPU and then translated into a dielectric layer thickness in that region. Moreover, a third light interference signal may be taken at time t3 from an annular region about midway between the center and outer regions.

In one embodiment, t1=t2, and a difference in dielectric layer thickness (dishing difference) between the center and outer annual regions is converted into a pre-clearing time difference (C3 delta) assuming the initial polish conditions are continued to an end process time at tF where a first portion of the dielectric layer is cleared above the etch stop layer, usually in the center or near the edge of the substrate. Clearing time is defined as an actual end point when reflected light interference signals from the etch stop layer indicate that the dielectric material above the etch stop layer is completely removed at a certain region on the substrate. Pre-clearing time is an estimated clearing time for an annular region based on the detected light interference signals during a C3 delta measurement that preferably occurs near a mid-point in the polish cycle. For example, if total process time is about 70 seconds, a C3 delta measurement may be performed between 20 and 50 seconds after the start of the polish cycle. Optionally, time t1 precedes t2, or t2 precedes t1 by 1 or 2 seconds. Preferably, light interference signals are collected during a time period when the light signals from the at least two different annular regions are out of phase. Light intensity data collected by the detector is inputted to a CPU.

The CPU has proprietary software that calculates a pressure adjustment for the retaining ring and substrate backside (CMP head membrane) based on the dishing difference calculated from light interference signals from the detector. Typically, the dishing difference is in terms of pre-clearing time difference (seconds) and a look up table is employed to prescribe a certain pressure adjustment based on the magnitude of the C3 delta measurement. As mentioned earlier, a C3 delta between any two annular regions may be performed to make a CMP pressure adjustment during the same polish cycle. However, the pre-clearing time difference between center and outer annular regions is usually greater than between any other two annular regions. Therefore, CMP pressure adjustment in response to the largest detected pre-clearing time difference should provide the greatest advantage in terms of minimizing thickness non-uniformity at the end of the polish cycle. A pressure adjustment is fed back to the CMP controller and triggers a pressure adjustment at a time tA that may be a few milliseconds following the t1 and t2 reflected light interference signal collection.

Between tA and the final process time tF, the pressure adjustment is applied. As a result, total process time is not increased from the original tF target, and center to edge metal thickness variation is minimized compared with the prior art where original pressure values are continued throughout the process and not applied until a second polish cycle.

In a second embodiment, a single polish cycle may comprise two pressure adjustments at different times. A first pressure adjustment is performed at time tP1 similar to tA in the first embodiment. Thereafter, a second set of reflected light interference measurements is collected at times t4 and t5 following time tP1. For example, a reflected light interference signal from the outer annular region is analyzed at time t4 and a reflected light interference signal from the center annular region is analyzed at time t5 where t4=t5, or t4 and t5 preferably occur within two seconds of each other when the light interference signals from the two annular regions are preferably slightly out of phase with each other. Thereafter, a second pressure adjustment is calculated by the CPU and fed back to the CMP controller, and one or both of the retaining ring and CMP head membrane has the second pressure adjustment applied from time tP2 to a final cycle time end point tF.

DETAILED DESCRIPTION

The present disclosure is an adaptive feedback control method also referred to as an adaptive end point control method for minimizing film non-uniformity during a single polish cycle so that a second polish cycle is unnecessary. The terms "wafer" and "substrate" may be used interchangeably. The CMP adaptive feedback control method defined herein may be applied to 6", 8", 12" or other size substrates and is driven by proprietary software in a central processing unit (CPU).

The inventors currently practice a CMP process that planarizes a metal layer formed within one or more dielectric layers. The metal layer may be a bit line or word line in a MRAM formed by a damascene process, for example, or a capping layer in a magnetic tunnel junction (MTJ) element. It should be understood that the metal layer is not limited to Cu but may be other metals or alloys used in the art. Although a conventional end point detect system comprised of reflected light interference measurements is typically used to monitor dielectric film thickness at various locations on a substrate during a polish cycle, there is no pressure adjustment applied to the substrate backside or retaining ring surrounding the substrate during the polish cycle. Instead, one or both of AFM and scanning electron microscope (SEM) measurements performed after a polish cycle is completed may be used to monitor film thickness non-uniformity across a substrate from batch to batch and to calculate a pressure adjustment for a second polish cycle on a previously planarized substrate or for a first polish cycle on another substrate waiting to be planarized.

Figure 3:
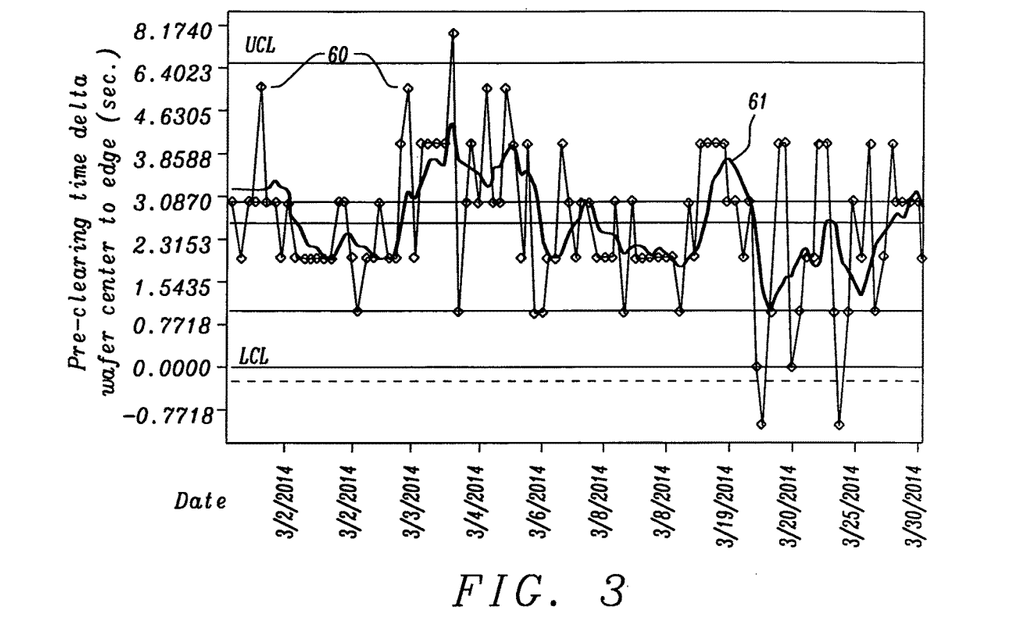
FIG. 3 is a moving average plot showing pre-clearing time difference between center and outer annular regions on a substrate according to a process currently practiced by the inventors.

Referring to FIG. 3, a chart is illustrated for a CMP process of record where a clearing time difference between center and edge of several substrates is plotted as a plurality of points 60 each representing a batch, and a run time average line 61 is compiled over a plurality of weeks. In this case, a center to edge clearing time average difference of 2.8 seconds is observed after a plurality of batches where each batch may comprise up to 25 wafers. This result may be programmed into the CMP controller to adjust the pressure conditions for subsequent batches with the aim of reducing the center to edge film thickness non-uniformity after a single polish cycle. However, as shown by FIG. 3, even with pressure conditions applied in response to a clearing time running average difference, there is still a substantial non-uniformity from batch to batch. A new method is needed to make real time corrections that substantially minimize non-uniformity across a substrate within a single polish cycle, and reduce batch to batch (wafer to wafer) non-uniformity.

Figure 1A:
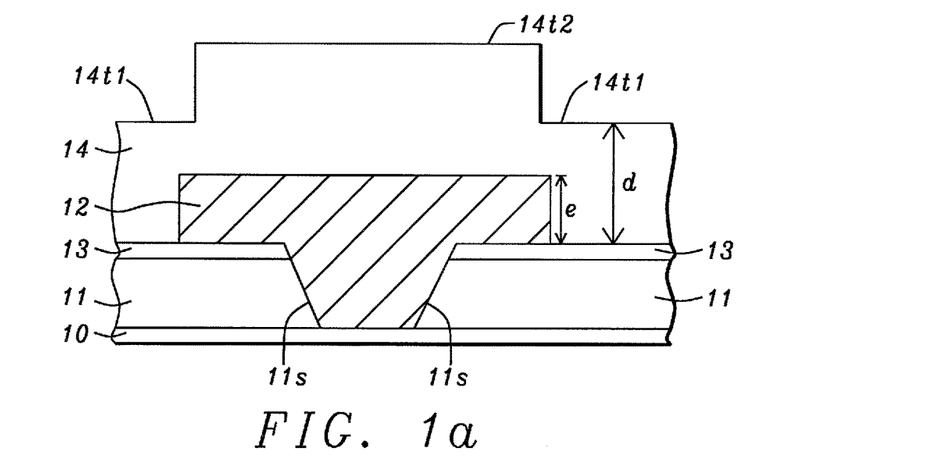
FIG. 1a is a cross-sectional view showing a damascene structure wherein a metal layer is formed within a dielectric layer prior to a CMP process.

Referring to FIG. 1a, an intermediate step in a damascene process flow is depicted where a substrate 10 that has a sub-structure with a plurality of metal and dielectric layers (not shown) is provided. A first interlevel dielectric layer (ILD) 11 comprised of alumina or the like is formed on the substrate and has an opening bounded by sidewalls 11s. Metal layer 12 may be a word line or bit line and fills the opening between sidewalls 11s, and extends a certain distance e above the first ILD. Also, contacting a top surface of the first ILD is an etch stop layer 13 that may be made of Ru or another metal or alloy with a chemical and mechanical etch resistance substantially exceeding that of a dielectric material such as alumina which is used in a second ILD 14. Usually, the second ILD is conformally deposited such that a top surface 14t2 is formed approximately a distance d above metal layer 12 and top surface 14t1 is a distance d above the etch stop layer in regions adjacent to metal sidewalls 12s where d>e.

Figure 1B:
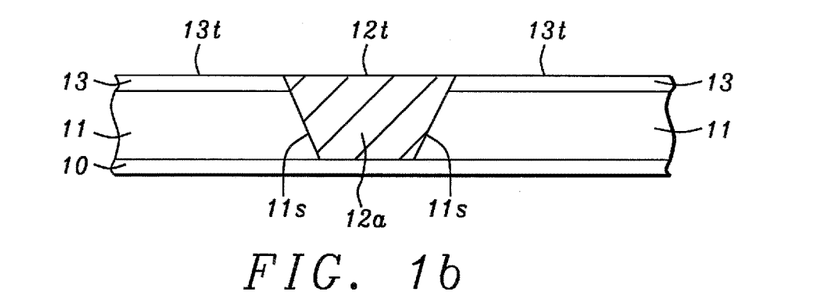
FIG. 1b is a cross-sectional view of the damascene structure from FIG. 1a after a CMP process planarizes a top surface thereof.

In FIG. 1b, the damascene structure depicted in FIG. 1a is shown after a CMP process is completed. Preferably, the portions of metal layer 12 and second ILD 14 above the etch stop layer 13 are removed to leave an etch stop layer top surface 13t that is coplanar with a top surface 12t of metal layer between sidewalls 11s. It is important that the metal layer has a uniform thickness across the wafer in order to provide uniform resistance values across the wafer. Typically, a plurality of parallel metal layers (not shown) is formed within the first ILD 11 but only one metal layer is shown to simplify the drawing. Thereafter, additional metal layers and dielectric layers (not shown) may be fabricated above metal layer 12 in the damascene structure to form interconnections between metal layers.

Figure 2:
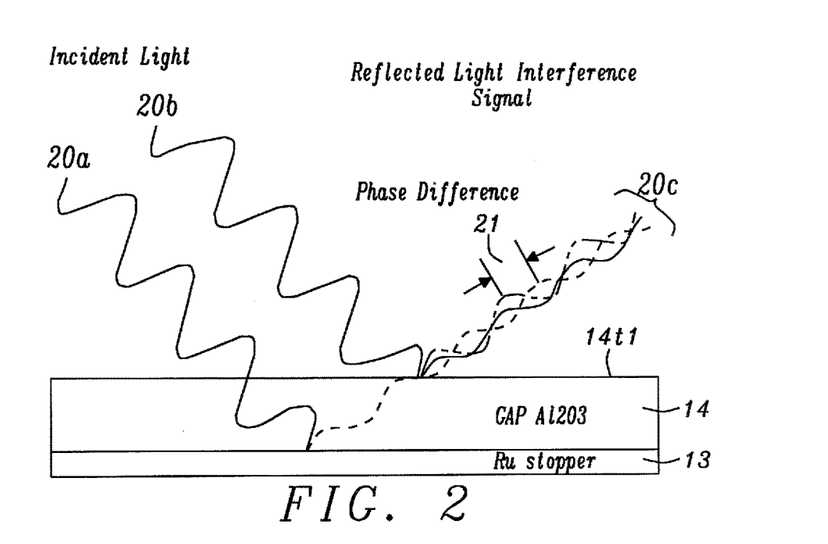
FIG. 2 is a diagram showing how a phase difference is created as a result of reflected light from the etch stop layer and the dielectric layer in a damascene structure according to an embodiment of the present disclosure.

Referring to FIG. 2, an end point detect system operates with a plurality of incident light signals 20a, 20b from a light source (not shown) that reflect off the etch stop layer 13, and second ILD 14, respectively. The reflected light signals form an interference pattern 20c that is captured by a detector (not shown) and used to calculate a phase difference 21 that indicates a thickness of the second ILD in a region with top surface 14t1 above the etch stop layer.

Figure 4A:
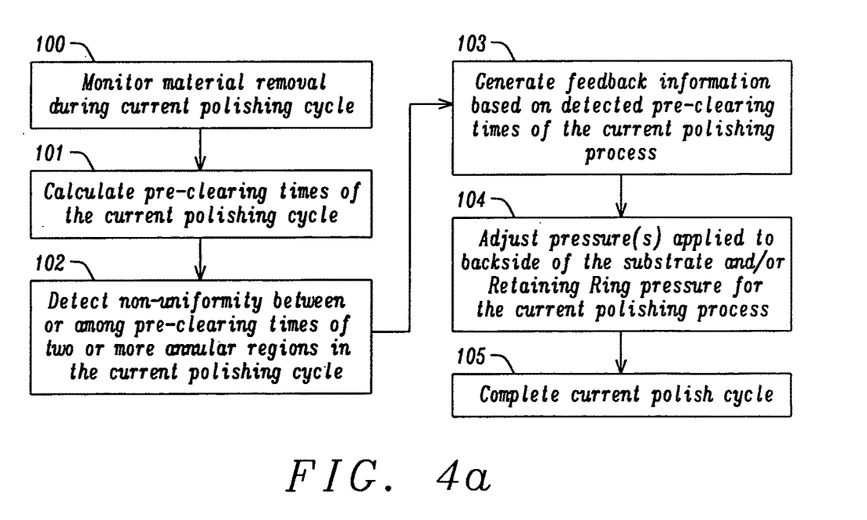
FIG. 4a is a process flow according to one embodiment of the present disclosure where a CMP pressure adjustment is made in response to pre-clearing time measurements during a single process cycle.

A first embodiment of the present disclosure is depicted in the flow diagram in FIG. 4a. In step 100, removal of material from a substrate during a first portion of the polish cycle during a CMP process is monitored by an optical end point detect system as described previously. The optical system includes a source for providing incident light to a substrate surface, and a detector that captures reflected light in the form of interference signals from the dielectric layer and an etch stop layer. In step 101, light intensity data from the reflected light interference signals from at least two annular regions of the substrate is inputted to a CPU where pre-clearing times for the at least two annular regions are computed. Then in step 102, the CPU calculates a dishing difference (non-uniformity) between the at least two annular regions that may be a center annular region and an outer (edge) annular region. Next, the pre-clearing non-uniformity information is used to generate feedback data to the CMP controller in step 103. In step 104, the feedback data triggers a pressure adjustment to one or both of the retaining ring pressure and CMP head membrane pressure that is applied until the completion of the polish cycle at step 105.

Figure 4B:
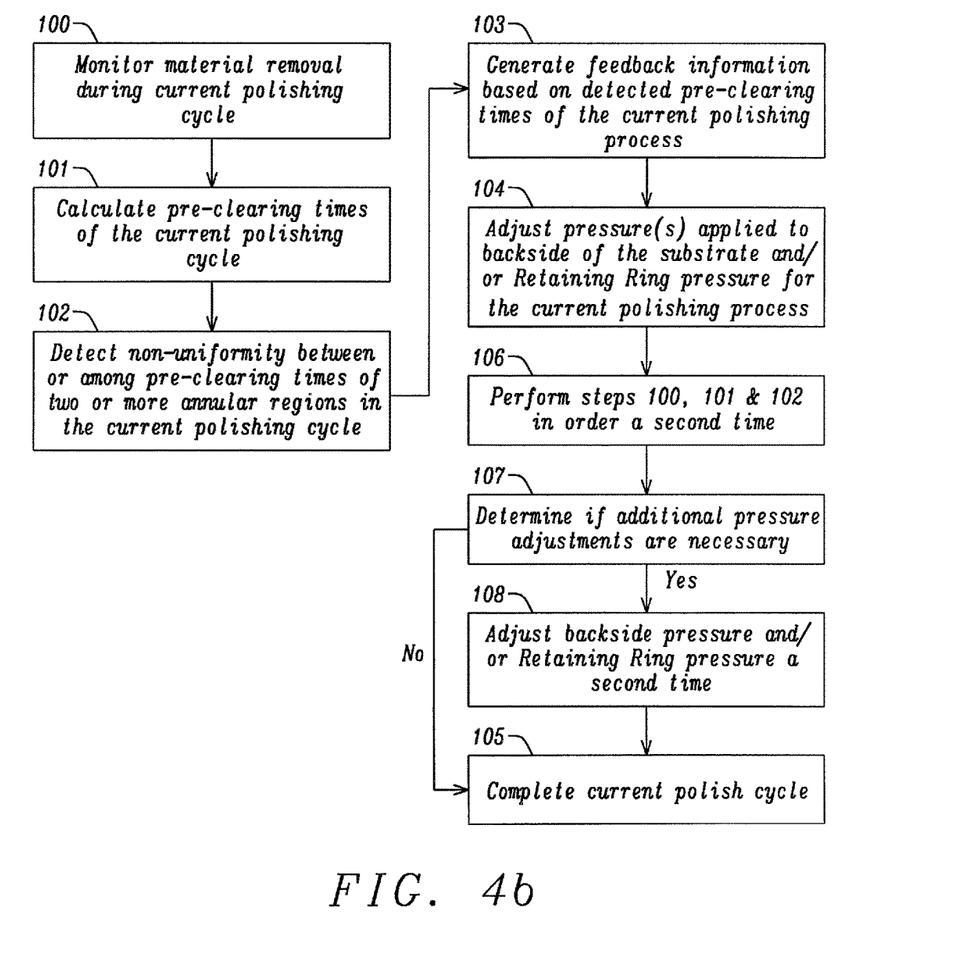
FIG. 4b is a process flow according to another embodiment of the present disclosure where more than one CMP pressure adjustment is made in response to more than one set of pre-clearing time measurements during a single process cycle.

According to a second embodiment depicted in FIG. 4b, the initial five steps 100-104 from the first embodiment are retained with the exception that the pressure adjustment is applied but not necessarily maintained. Instead, before reaching a final step 105, steps 106-107 or 106-108 are performed. Step 106 comprises collecting a second set of reflected light interference signals after the first pressure adjustment, inputting the light intensity data to the CPU where a second set of pre-clearing time data is computed between at least two annular regions on the substrate. Thereafter, in step 107, the CPU determines whether or not a second pressure adjustment will advantageously provide a minimized clearing time difference between the at least two annular regions at the end of the polish cycle. If the answer is no, the current polish conditions are continued until step 105 when the polish cycle ends. When the answer is yes, step 108 is inserted and comprises feedback of a second pressure adjustment to the CMP controller and then adjusting at least one of the CMP head membrane pressure and retaining ring pressure until the end of the polish cycle at step 105. Note that step 100 may require up to about two seconds and CPU process time during steps 101-103 generally is accomplished within a few milliseconds. Likewise, step 104 may occur within a second that means the entire adaptive feedback control method of the present disclosure may be implemented without a significant effect on total polish time. In some embodiments, steps 100-105 or 100-108 may be performed in the same time period as a prior art polish cycle practiced by the inventors wherein no real time pressure adjustments are computed or applied.

Figure 5:
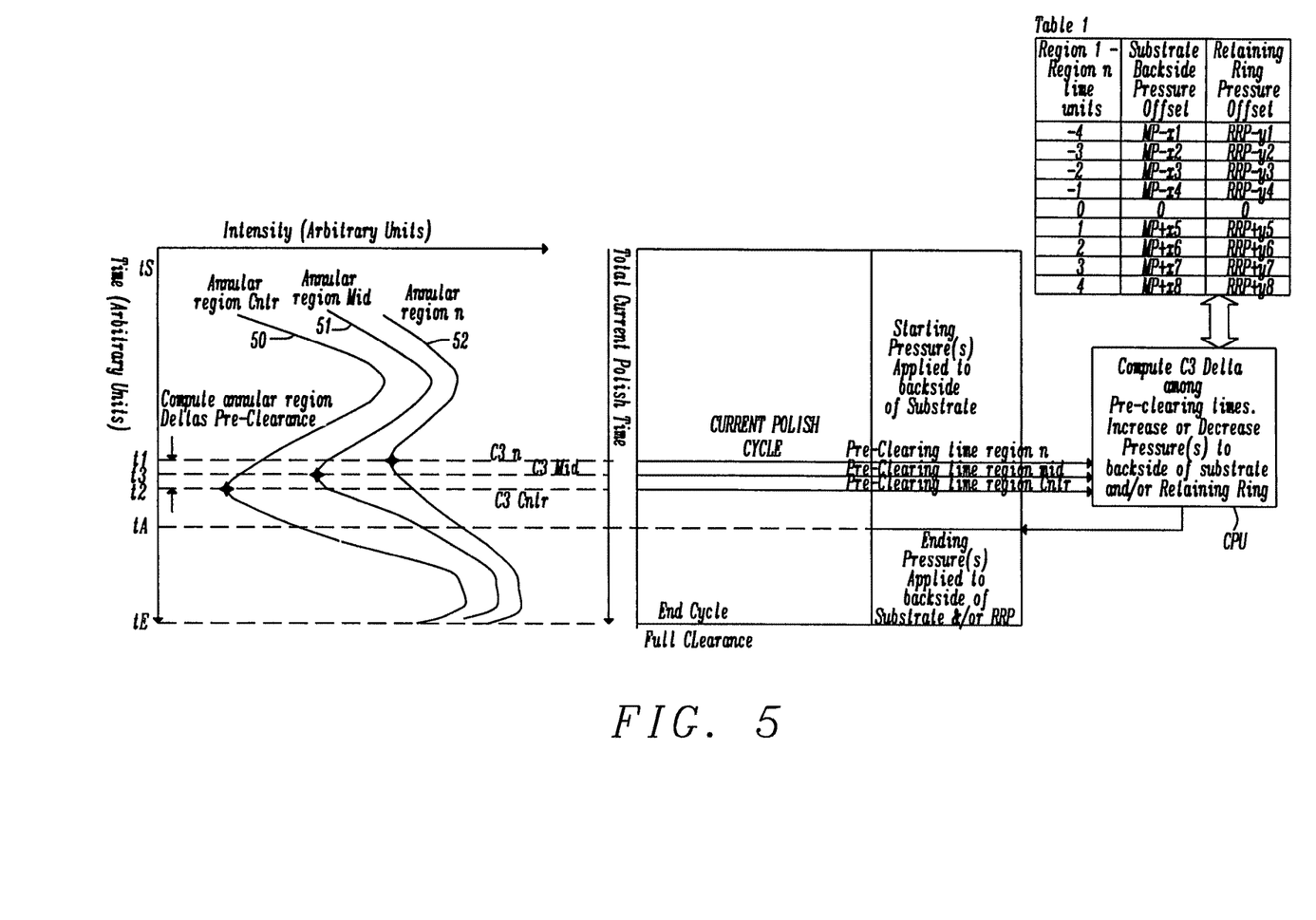
FIG. 5 depicts a timeline where light intensity measurements during a CMP process are taken, pre-clearing times are calculated for two or more annular regions, and are used to make a pressure adjustment to improve film uniformity during a single process cycle.

The first embodiment is graphically illustrated in FIG. 5 that shows a timeline for the various steps in the adaptive feedback control method also referred to as an adaptive end point (AEP) control method. A plot on the left side (vertical axis) depicts a timeline for a single polish cycle that begins at tS and ends at tF where the latter may be 60 to 500 seconds after the start time. The horizontal axis represents light intensity that is reflected from the surface of the substrate. Curve 50 corresponds to light intensity from a reflected light interference signal from a center annular region of the substrate, curve 51 is light intensity from a reflected light interference signal from an annular region midway between the center and edge of the substrate, and curve 52 is light intensity from a reflected light interference signal from an outer annular "n" region. The outer annular region has a larger signal magnitude since the region has a larger area and more light is reflected in that annular region. All three curves have maximum and minimum points that are not necessarily in phase with each other. In the exemplary embodiment, times t3, t2, and t1 occur proximate to a minimum in light intensity on curves 51, 50, 52, respectively. Preferably, subsequent pressure adjustment calculations are taken from reflected light interference signals at times t1-t3 when the light intensity curves are not completely in phase with one another.

At time t1, a first reflected light interference signal from the outer annular region is collected by a detector (not shown) and inputted to a CPU. In addition, a second reflected light interference signal from a center annular region is collected at time t2 and a third reflected light interference signal from a mid annular region is collected at time t3 and sent to the CPU where a software program is used to convert a phase difference (FIG. 2) to a dielectric layer thickness in each annular region. The thickness d in FIG. 1a at time tS gradually becomes smaller until reaching zero at time tF (FIG. 1b). Thickness non-uniformity between any two annular regions at any time during the polish cycle is called a dishing difference. Then, a C3 delta pre-clearing time difference is computed between at least two different annular regions. For example, the dishing difference between outer and center annular regions determined from light intensity data at times t1, t2, respectively, is converted by the CPU to a difference in estimated clearing times assuming the current polish conditions are continued to time tF. A table (Table 1) with prescribed substrate backside (CMP head membrane) pressure and retaining ring pressure adjustments corresponding to various pre-clearing time differences is used to determine the appropriate feedback data to the CMP controller (not shown).

Figure 6:
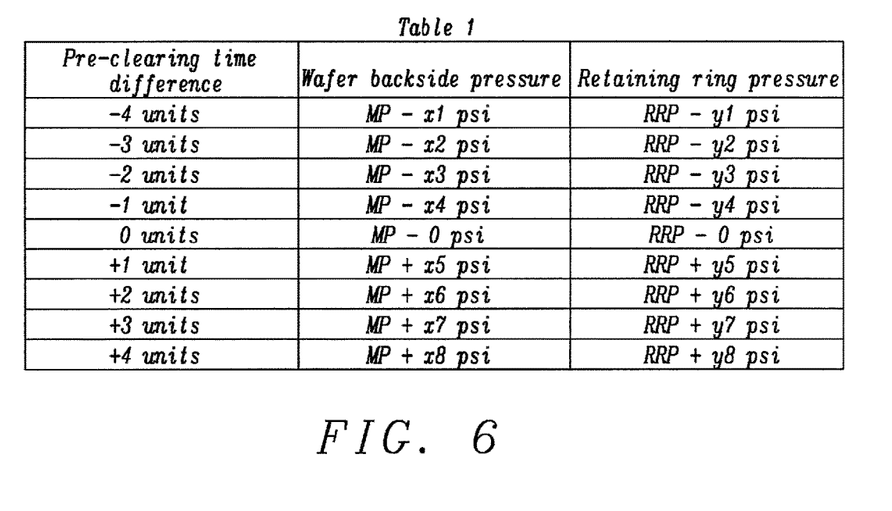
FIG. 6 shows one example of a look up table that is used to determine a pressure adjustment during a CMP single polish cycle according to an embodiment of the present disclosure.

In FIG. 6, an enlarged view of Table 1 according to one embodiment is provided. The table has nine rows corresponding to nine pre-clearing time differences varying from −4 units to +4 units (first column) between center and outer annular regions in order to simplify the drawing. A negative pre-clearing time difference in the first column means the dielectric layer 14 (FIG. 1a) will be cleared in the center annular region of the substrate before clearing in the outer annular region. In actual practice, Table 1 may have a substantially larger number of rows and feature pre-clearing time differences in increments of 0.1 to 0.01 units where a unit may be a second or a fraction of a second. The middle column indicates a CMP head membrane pressure adjustment in terms of psi relative to the starting pressure. In row 1 for example, a pre-clearing time difference of −0.4 units triggers a CMP head membrane pressure decrease of −x1 psi compared with a starting membrane pressure (MP). Similarly, a pre-clearing time difference of −4 units leads to a retaining ring pressure (RRP) adjustment decrease of −y1 psi compared with a RRP value at time tS.

MP adjustments are provided in units of x1 up to x8 psi and RRP adjustments are listed as y1 up to y8 including a possible zero adjustment for either pressure. Each xn value and yn value, where n is from 1 to 8 in the exemplary embodiment but may be a substantially larger number in other embodiments, may have a magnitude between 0.01 and 1. In other embodiments with "n" rows in Table 1, there will be xn different MP psi adjustments that may include a zero value, and there will be yn different RRP psi adjustments including a possible zero value. Note that the CMP head membrane pressure and RRP adjustments in a certain row in Table 1 may not always be in the same direction (− for decrease or + for increase). There may be a (−xn) MP adjustment paired with a 0, (−yn), or +yn RRP adjustment, or a 0 or +xn MP adjustment with a 0, (−yn), or +yn RRP adjustment.

A decrease in RRP causes a reduction in retaining ring pressure on the polish pad at the wafer edge which in turn leads to a rebound of the pad proximate to the outer annular region of the substrate thereby causing an enhanced rate of material removal in the outer annular region without significantly impacting the rate of material removal from the center annular region. CMP head membrane pressure (MP) relates to the pressure applied to the backside of the substrate inside the CMP head. Therefore, an increase in MP pressure effectively allows the substrate front side to be polished with an increased rate of material removal. For some CMP tools, there is only one CMP head membrane pressure zone such that a change in MP is applied essentially uniformly across the substrate.

Figure 7:
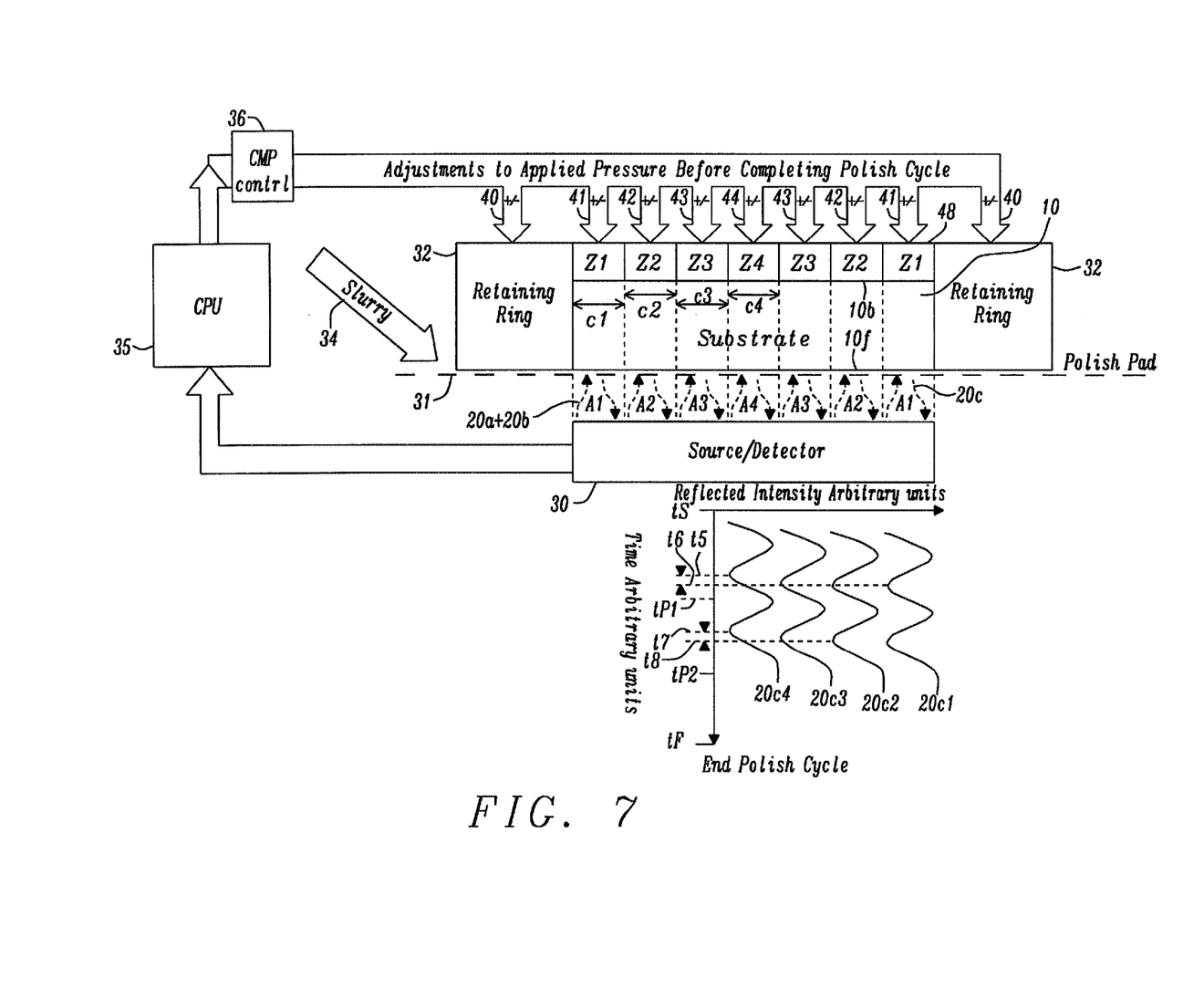
FIG. 7 is a cross-sectional view of a CMP tool layout according to one embodiment of the present disclosure where light intensity readings from a detector below a polish pad are fed into a CPU, pre-clearing times are calculated, and then one or more pressure adjustments are inputted to the CMP tool to adjust one or both of the retaining ring pressure, and CMP head membrane pressure at a plurality of annular pressure zones on a substrate.

In another embodiment depicted in FIG. 7, there may be more than one pressure zone in the membrane 48 at the backside 10b of a substrate 10 during a polish cycle. In the exemplary embodiment, four annular pressure zones Z1-Z4 formed as concentric rings with Z4 in the center, Z1 as the outer zone, Z2 adjacent to Z1, and Z3 adjacent to Z4 are depicted at the substrate backside. In this case, the four annular pressure zones in the membrane overlap the four annular regions A1-A4 on the front side 10f of the substrate where A4 is the center annular region, A1 is the outer annular region, A2 is a first mid annular region aligned below zone Z2 and A3 is a second mid annular region that is aligned below zone Z3. Thus, a diameter of each zone is essentially equal to that of the corresponding annular region on the front side. For example, there is a ring diameter c1 for the annular region A1 and zone Z1, c2 for annular region A2 and zone Z2, c3 for annular region A3 and zone Z3, and c4 for annular region A4 and zone Z4.

An optical, system 30 comprising a light source and detector is positioned below the polish pad 31 and substrate 10 during a CMP process wherein slurry 34 is introduced between the polish pad and substrate front side 10f. The source projects light through an optical window (not shown) that constantly moves underneath the substrate. In less than a second, the optical system is capable of providing incident light 20a, 20b to all four annular regions A1-A4 and collecting reflected light interference signals 20c therefrom.

According to one embodiment, a light interference signal 20c4 from the center annular region and a light interference signal 20c1 from the outer annual region are collected at times t5 and t6, respectively, and then inputted to CPU 35. A pre-clearing time (C3 delta) difference as described earlier is calculated for annular regions A1 and A4 on the substrate front side. The process flow found in FIG. 4a may be followed to determine a pressure adjustment that is sent to the CMP controller 36. In some embodiments, the CPU and CMP controller are the same device and not separate units. If annular region A4 is found to be thinning faster than annular region A1, a pressure adjustment will be made to increase the thinning rate in annular region A1 relative to that in annular region A4. Conversely, if annular region A4 is thinning slower than annular region A1, a pressure adjustment is made to increase the thinning rate in annular region A4 relative to that in annular region A1.

Figure 8:
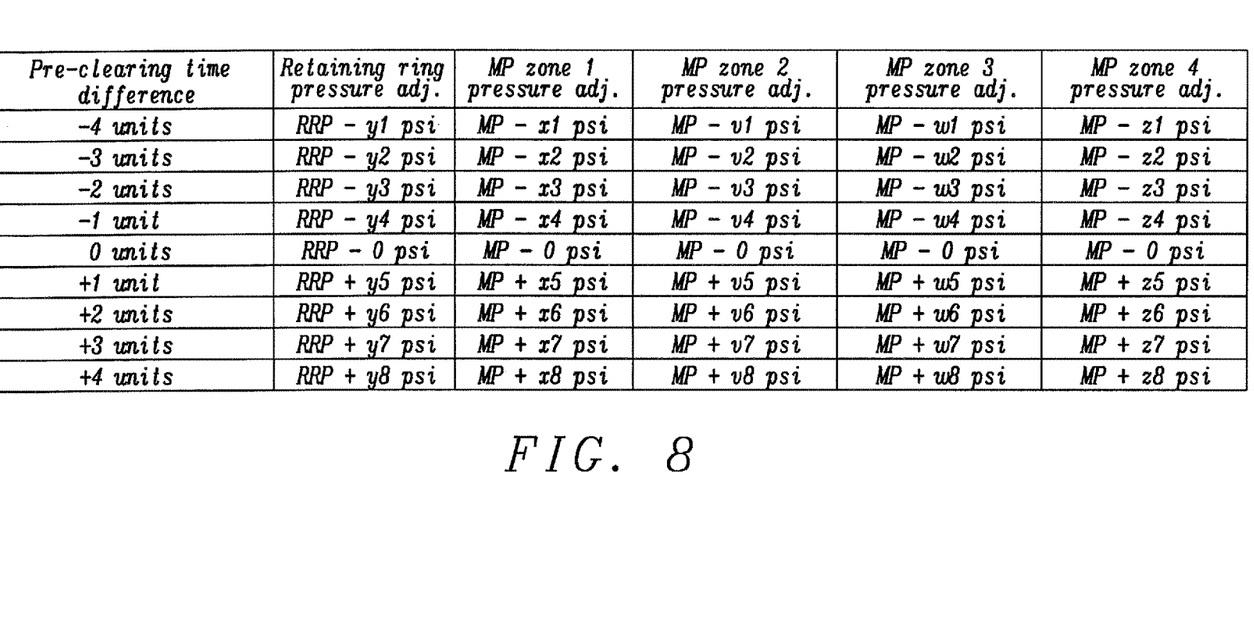
FIG. 8 shows an example of a look up table that is used to determine a pressure adjustment during a CMP single polish cycle according to a second embodiment of the present disclosure.

A first pressure adjustment is made at time tP1 and comprises one or both of pressure adjustment 40 to the retaining ring at the edge of the substrate, and a CMP head membrane pressure adjustment to the substrate backside. Preferably, the backside pressure adjustment comprises MP adjustment 41 to backside zone Z1, MP adjustment 42 to backside zone Z2, MP adjustment 43 to backside zone Z3, and MP adjustment 44 to backside zone Z4 that is maintained until the end of the polish cycle at time tF. In this case, Table 2 with a pressure adjustment column for each membrane zone may be employed where x1-x8 values apply to zone Z1, v1-v8 values apply to zone Z2, w1-w8 values apply to zone Z3, and z1-z8 values apply to zone Z4. Similar to the first embodiment, each positive or negative CMP head membrane pressure adjustment may be from 0.01 to 1 psi in absolute value. Furthermore, in other embodiments with n rows in Table 2 where n may be substantially greater than nine, one or more of the vn, wn, xn, yn, and zn values may be 0, a negative number, or a positive number in a row.

In an alternative embodiment, when pre-clearing times are calculated from only two annular regions out of "n" annular regions on a substrate, then a CMP head membrane pressure adjustment may be made only to the two MP zones aligned above the two annular regions from which the pre-clearing time difference is calculated. For example, when pre-clearing time differences are computed between annular regions A1 and A4, the backside pressure adjustment in the previous embodiment may be modified to include pressure adjustments only to zones Z1 and Z4 while initial MP values are maintained in zones Z2 and Z3. Therefore, only values x1 to x8 in zone Z1 and values z1 to z8 in zone Z4 will be applied. All v1 to v8 values and all w1 to w8 values will not be applied to make a CMP head membrane pressure adjustment.

In yet another embodiment that follows the process flow in FIG. 4b and timeline in FIG. 7, a second set of reflected light interference signals may be collected a certain time after the RRP adjustment 40 and MP adjustments 41-44 are applied. For example, step 106 comprises the collection of a second light interference signal 20c4 at time t7, and a second light interference signal 20c1 at time t8 followed by determining a second pre-clearing time difference assuming the conditions applied during the first pressure adjustment to MP and RRP at time tP1 are maintained until the polish cycle is completed. When the CPU 35 determines in step 107 that improved thickness uniformity will occur if a second set of MP and RRP pressure adjustments are applied, then one or more of the MP and RRP are adjusted a second time at point tP2 as represented by step 108 in FIG. 4b. In this case, Table 2 is utilized a second time to determine the magnitude of the MP and RRP adjustment at time tP2.

The present disclosure also anticipates that a second set of reflected light interference signals may be obtained and a second pressure adjustment applied to one or both of the retaining ring pressure and CMP head membrane pressure after time to in the first embodiment depicted in FIG. 5. Furthermore, if the polish cycle is a substantially large amount of time, >70 seconds for example, the present disclosure also encompasses an embodiment where more than two pre-clearing time differences are detected at different times during the polish cycle, and a pressure adjustment is made after each pre-clearing time difference is computed and a pressure adjustment is determined from a look up table.

Figure 9:
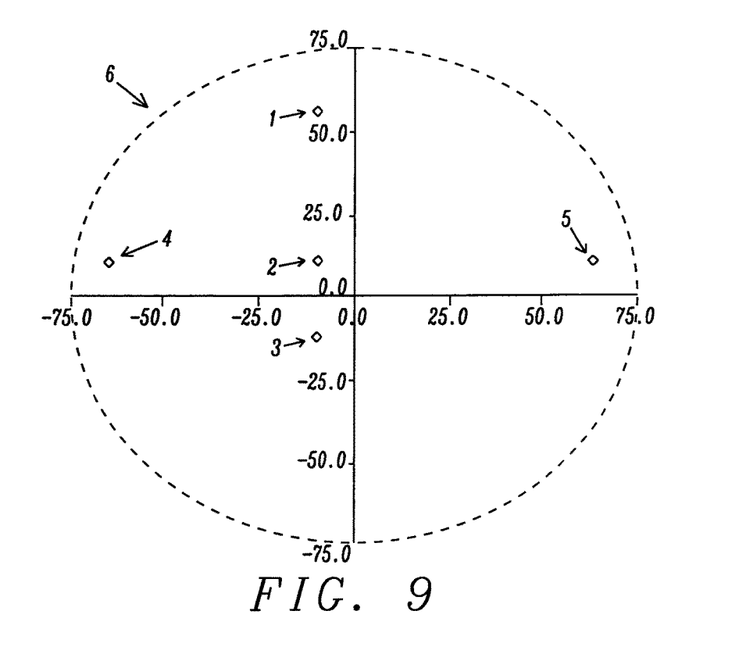
FIG. 9 depicts a wafer layout that is used to obtain atomic force microscopy (AFM) measurements to determine dishing uniformity after the completion of a polish cycle.

The present disclosure also encompasses an embodiment wherein more than one reflected light interference signal may be collected from each annular region during a pre-clearing time difference determination. FIG. 9 illustrates an example wherein reflected light interference data is collected from three different areas 1, 4, and 5 in an outer annular region on a circular substrate 6. A phase difference 21 (FIG. 2) is obtained for each of the three areas and converted to a film thickness measurement. An average value for the three thickness measurements is translated into a pre-clearing time for the outer annular region. Similarly, two thickness measurements are derived from reflected light interference data from areas 2 and 3 in the center annular region. Note that the detector may collect light intensity data from all five areas in less than 1 second, and preferably in less than 200 milliseconds. The average thickness of areas 2 and 3 is used to calculate a pre-clearing time for the center annular region. Then a look up table similar to Table 1 is employed to compute a pressure adjustment to one or both of the retaining ring and CMP head membrane depending on the pre-clearing time difference between the center and outer annular regions.

In order to verify the anticipated improvement in thickness non-uniformity by implementing the CMP adaptive end point method described herein, SEM measurements were taken on a plurality of wafers following completion of a single polish cycle depicted in FIG. 5 where only one pressure adjustment is made in response to a pre-clearing time difference between a center annual region and an outer annular region. The x-axis values in the following plots represent the time difference t1–t2 in FIG. 5 and are in whole seconds (−2, −1, 0, +1, or +2). Thus, t1 may occur 1 or 2 seconds before, 1 or 2 seconds after, or at the same time as t2. The results in FIG. 11a from an AEP control method are compared with data in FIG. 10a from a process of record where no pressure correction is made during the same polish cycle in which a pre-clearing time difference between two annular regions is determined.

Figure 10A:
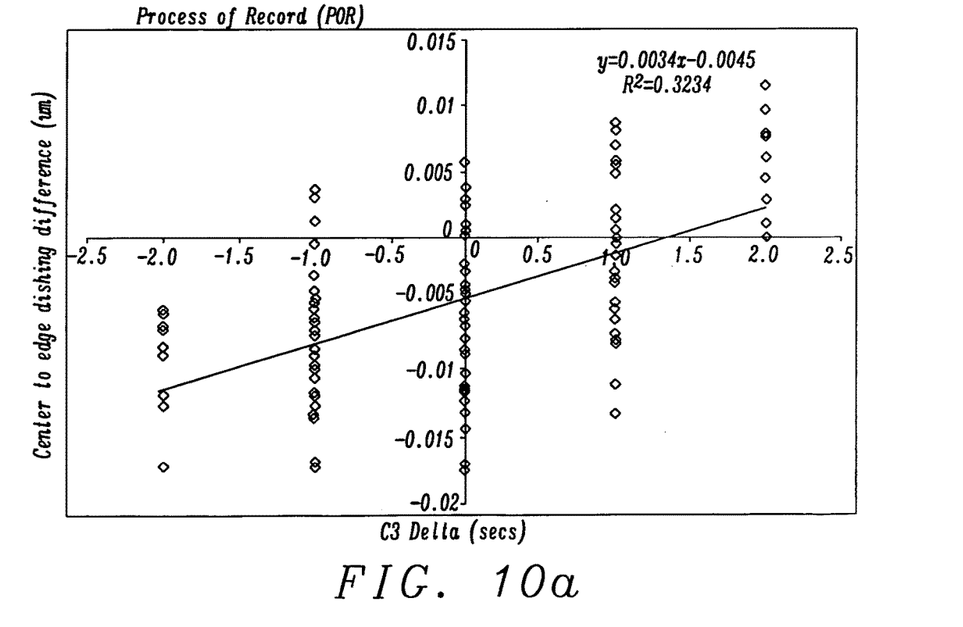
FIG. 10a is a plot of dishing difference (non-uniformity) between wafer center and edge for various C3 delta times from scanning electron microscope measurements and represents a process of record.
Figure 11A:
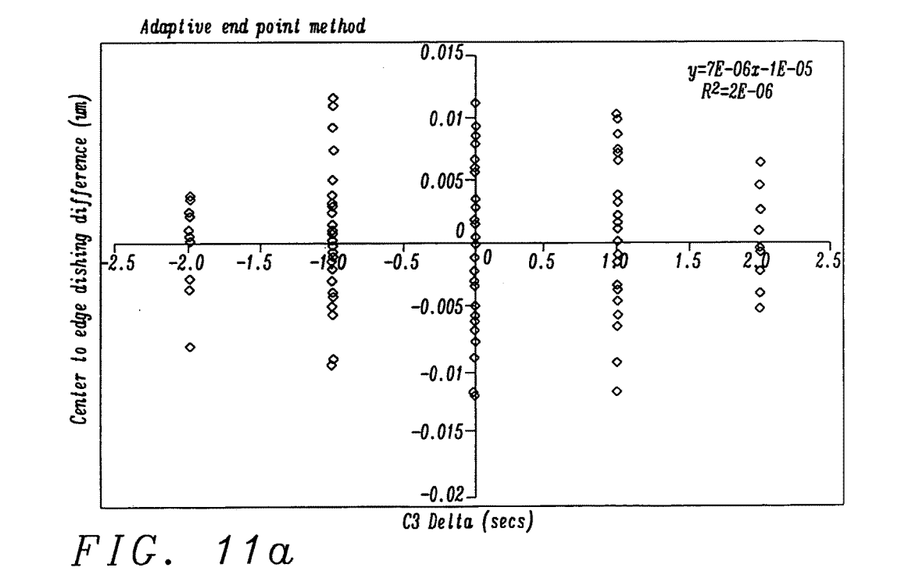
FIG. 11a is a plot of dishing difference between wafer center and edge for various C3 delta times from SEM measurements after an adaptive end point method of the present disclosure is implemented.

FIG. 10a and FIG. 11a show a dishing difference (thickness non-uniformity) in terms of microns between center and outer annular regions for various C3 delta times. The advantage of the AEP control method of the present disclosure is clearly demonstrated in that FIG. 11a data is more closely clustered around the y-axis target value of zero non-uniformity than FIG. 10a results.

Figure 10B:
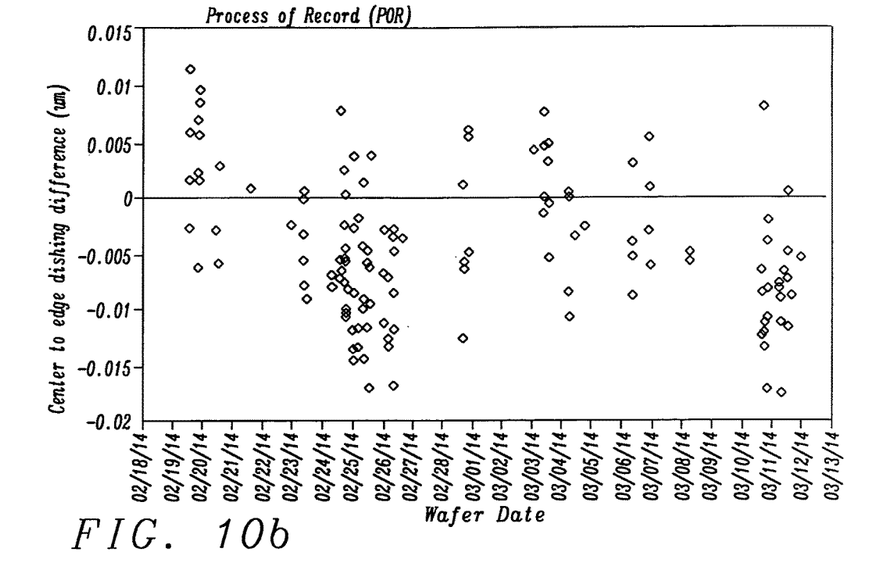
FIG. 10b is dishing difference data from FIG. 10a that is plotted as a function of wafer polishing date.
Figure 11B:
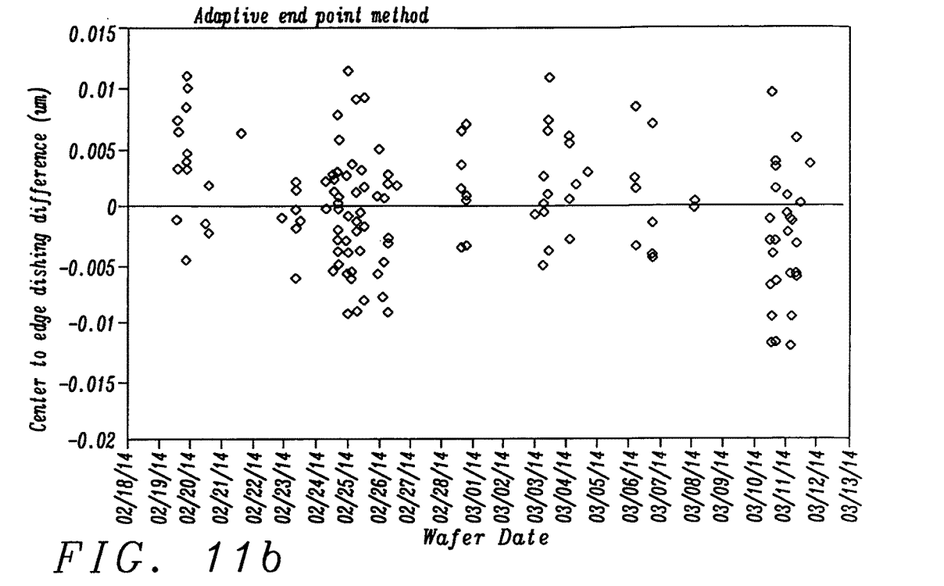
FIG. 11b is dishing difference data from FIG. 11a that is plotted according to wafer polishing date.

FIG. 10b and FIG. 11b show an alternative view of presenting the data in FIG. 10a and FIG. 10b, respectively. In particular, the non-uniformity results are plotted according to the date each substrate was processed with earliest dates on the left side and the most recent dates on the right side of each chart.

Figure 12:
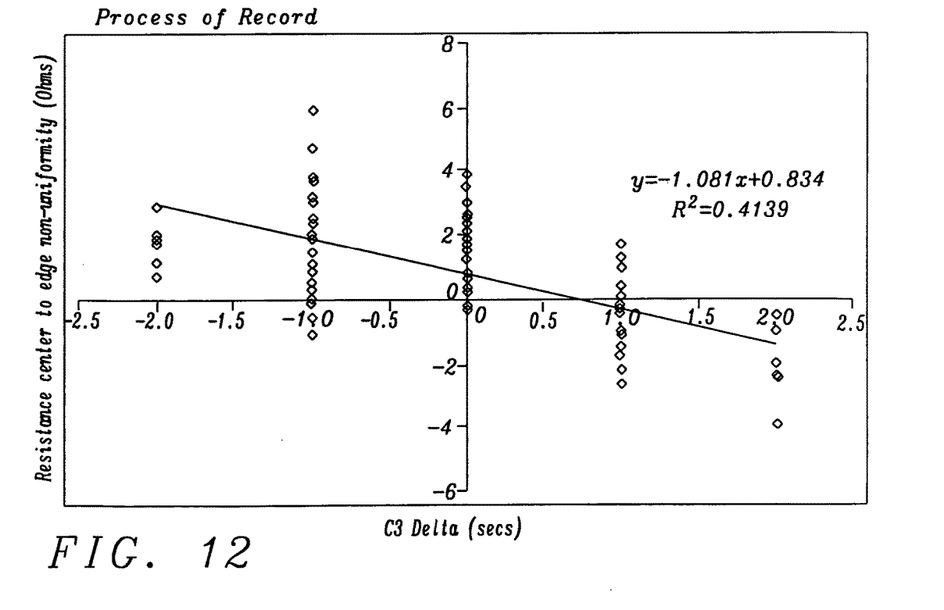
FIG. 12 is a plot of resistance difference between wafer center and edge compiled from a plurality of wafers that are polished by the process of record.
Figure 13:
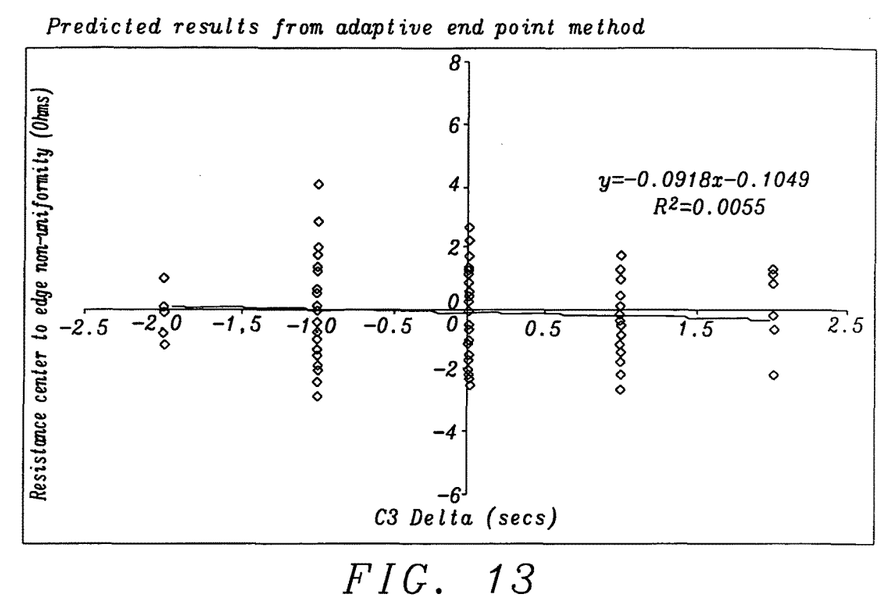
FIG. 13 is a plot of resistance difference between wafer center and edge after an adaptive end point (AEP) control method according to the present disclosure is implemented.

As mentioned previously, it is also important to minimize non-uniformity of metal layer resistance across a substrate and from one substrate to another (wafer to wafer). Since resistance correlates to thickness in a metal layer, a smaller value in thickness non-uniformity (dishing difference) translates to a smaller non-uniformity in resistance difference between center and annular regions. Comparing FIG. 13 with FIG. 12 shows the advantage of the AEP control method in minimizing resistance non-uniformity. Note that data points in FIG. 13 from the AEP control method are more tightly clustered around the target y-axis value of zero than the data points in FIG. 12 that represents the CMP process of record (POR) practiced by the inventors.

Figure 14:
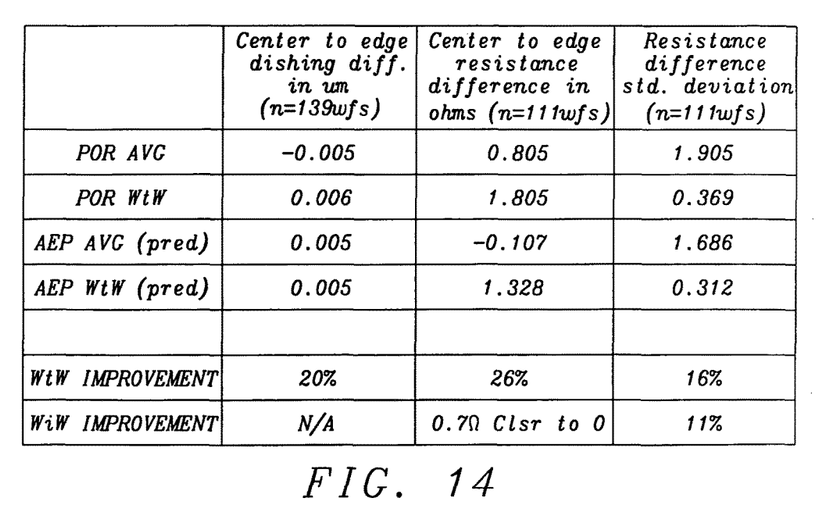
FIG. 14 is a table that shows average dishing difference between center to edge, average resistance difference, and resistance difference standard deviation for both of the process of record and AEP control method.

FIG. 14 shows a summary table of CMP process advantages provided by the AEP control method of the present disclosure. Wafer to wafer (WtW) dishing difference is reduced from 0.006 um (POR average) in row 2 to 0.005 urn (AEP average) in row 4 for an improvement of 20%. In addition, WtW resistance non-uniformity and standard deviation are both lowered. In particular, the POR resistance difference of 1.805+/−0.369 ohms becomes 1.328+/−0.312 ohms when the AEP control method is implemented for an improvement in resistance difference and standard deviation of 26% and 16%, respectively. Within wafer uniformity (WiW) improvement for resistance difference and standard deviation is also realized by the AEP control method as indicated in the bottom row of the table.

While this disclosure has been particularly shown and described with reference to, the preferred embodiment thereof, it will be understood by those skilled in the art that various changes in form and details may be made without departing from the spirit and scope of this disclosure.

We claim:

1. A chemical mechanical polish (CMP) adaptive feedback control method, comprising:
   (a) monitoring removal of a dielectric layer from a front side of a substrate during a CMP process by using an optical end point system, the front side of the substrate faces a polishing pad during a polish cycle while a substrate backside adjoins a CMP head membrane and is held in position by a retaining ring, the CMP process also removes a top portion of a metal layer that is within the dielectric layer and below a top surface of the dielectric layer;
   (b) determining a pre-clearing time of the dielectric layer removal for at least two annular regions on the substrate by collecting a reflected light interference signal from a first annular region at a first time (t1) after a polish cycle start time (tS), and collecting a reflected light interference signal from a second annular region at a second time (t2) after tS, the dielectric layer is formed on a metal etch stop layer in regions adjoining the top portion of the metal layer and the reflected light interference signal is comprised of light reflection from the dielectric layer and the metal etch stop layer in the regions adjoining the top portion of the metal layer;
   (c) calculating an adjustment to one or both of a retaining ring pressure and a CMP head membrane pressure that will minimize a clearing time difference between the first and second annular regions at an end of the polish cycle;
   (d) applying the adjustment to one or both of the retaining ring pressure and the CMP head membrane pressure during the CMP process; and
   (e) completing the polish cycle when a final portion of the dielectric layer is removed such that a top surface of the metal etch stop layer is coplanar with a top surface of the metal layer on the substrate.

2. The CMP adaptive feedback control method of claim 1 wherein the optical system comprises a source and optical window for providing incident light on a substrate, and a detector to capture the reflected light interference signals from a plurality of annular regions including the first annular region and the second annular region.

3. The CMP adaptive feedback method of claim 2 wherein a central processing unit (CPU) receives reflected light interference data from the detector, performs steps (b) and (c), and controls CMP conditions by providing input to trigger the pressure adjustment during the polish cycle.

4. The CMP adaptive feedback control method of claim 1 wherein a total process time for the polish cycle is from about 60 to 500 seconds.

5. The CMP adaptive feedback control method of claim 1 wherein a difference t1-t2 is equal to -2 seconds, -1 seconds, 0, +1 second, or +2 seconds.

6. The CMP adaptive feedback control method of claim 1 wherein the adjustment to the CMP head membrane pressure may be a negative value, 0, or a positive value, and the adjustment to the retaining ring pressure may be a negative value, 0, or a positive value.

7. The CMP adaptive feedback control method of claim 1 wherein a pre-clearing time difference between the first annular region and the second annular region is matched to a value in a row in a look up table, a value for the adjustment to the CMP head membrane pressure and a value for the adjustment to the retaining ring pressure are found in adjacent columns within the row.

8. The CMP adaptive feedback control method of claim 1 wherein the reflected light interference signals comprise reflected light from the dielectric layer, and reflected light from the metal etch stop layer that is formed between the substrate and the dielectric layer, a phase difference in the reflected light at time t1 corresponds to a dielectric layer thickness in the first annular region, and a phase difference in the reflected light at time t2 corresponds to a dielectric layer thickness in the second annular region.

9. The CMP adaptive feedback control method of claim 1 wherein the dielectric layer thickness in the first and second annular regions is obtained by averaging a phase difference in the reflected light interference signals from at least two different areas in each of the first and second annular regions.

10. The CMP adaptive feedback method of claim 1 wherein the polish cycle further comprises:
    (a) determining a second pre-clearing time of the dielectric layer removal for at least two annular regions on the substrate by collecting a reflected light interference signal from the first annular region at a third time and collecting a reflected light interference signal from the second annular region at a fourth time after the adjustment in step (d);
    (b) calculating a second adjustment to one or both of the retaining ring pressure and the CMP head membrane pressure in response to a second pre-clearing time difference that will minimize a clearing time difference between the first and second annular regions at an end of the polish cycle; and
    (c) applying the second adjustment to one or both of the retaining ring pressure and the CMP head membrane pressure that is maintained until the end of the polish cycle.

11. A chemical mechanical polish (CMP) adaptive feedback control method, comprising:
    (a) monitoring removal of a dielectric layer from a plurality of "n" annular regions on a substrate front side during a CMP process by using an optical end point system, the front side of the substrate faces a polishing pad during a polish cycle while a substrate backside adjoins a CMP head membrane and is held in position by a retaining ring, the CMP process also removes a top portion of a metal layer that is within the dielectric layer and below a top surface of the dielectric layer, and comprises a CMP head membrane pressure that is applied in a plurality of "n" annular zones;
    (b) determining a pre-clearing time of the dielectric layer removal for at least two annular regions on the substrate by collecting a reflected light interference signal from a first annular region at a first time (t1) after a polish cycle start time (tS), and collecting a reflected light interference signal from a second annular region at a second time (t2) after tS, the dielectric layer is formed on a metal etch stop layer in regions adjoining the top portion of the metal layer and the reflected light interference signal is comprised of light reflection from the dielectric layer and the metal etch stop layer in the regions adjoining the top portion of the metal layer;
    (c) calculating an adjustment to one or both of a retaining ring pressure and the CMP head membrane pressure in at least a first annular zone and a second annular zone that are aligned above the first and second annular regions, respectively, the adjustment will minimize a clearing time difference between the first and second annular regions at an end of the polish cycle;

(d) applying the adjustment to one or both of the retaining ring pressure and the CMP head membrane pressure in the at least first and second annular zones; and (e) completing the polish cycle when a final portion of the dielectric layer is removed such that a top surface of the metal etch stop layer is coplanar with a top surface of the metal layer on the substrate.

12. The CMP adaptive feedback control method of claim 11 wherein the optical system comprises a source and optical window for providing incident light on a substrate, and a detector to capture the reflected light interference signals from the plurality of annular regions including the first annular region and the second annular region.

13. The CMP adaptive feedback method of claim 12 wherein a central processing unit (CPU) receives reflected light interference data from the detector, performs steps (b) and (c), and controls CMP conditions by providing input to trigger the pressure adjustment during the polish cycle.

14. The CMP adaptive feedback control method of claim 11 wherein the pressure adjustment further comprises adjusting a CMP head membrane pressure in each annular zone that is aligned above an annular region that is not used to determine a pre-clearing time difference for the pressure adjustment.

15. The CMP adaptive feedback control method of claim 11 wherein the metal layer is in a damascene structure, or is a capping layer in a magnetic tunnel junction element.

16. The CMP adaptive feedback control method of claim 11 wherein the adjustment to the CMP head membrane pressure in the at least first and second annular zones may be a negative value, 0, or a positive value, and the adjustment to the retaining ring pressure may be a negative value, 0, or a positive value.

17. The CMP adaptive feedback control method of claim 11 wherein a pre-clearing time difference between the first annular region and the second annular region is matched to a value in a row in a look up table, a value for the adjustment to the CMP head membrane pressure in each of the at least first and second annular zones and a value for the adjustment to the retaining ring pressure are found in adjacent columns within the row.

18. The CMP adaptive feedback control method of claim 11 wherein the reflected light interference signals comprise reflected light from the dielectric layer, and reflected light from the metal etch stop layer formed between the substrate and the dielectric layer, a phase difference in the reflected light at time t1 corresponds to a dielectric layer thickness in the first annular region, and a phase difference in the reflected light at time t2 corresponds to a dielectric layer thickness in the second annular region.

19. The CMP adaptive feedback control method of claim 11 wherein the dielectric layer thickness in the first and second annular regions is obtained by averaging a phase difference in the reflected light interference signals from at least two different areas in each of the first and second annular regions.

20. The CMP adaptive feedback method of claim 11 wherein the polish cycle further comprises:

(a) determining a second pre-clearing time of the dielectric layer removal for at least two annular regions on the substrate by collecting a reflected light interference signal from the first annular region at a third time and collecting a reflected light interference signal from the second annular region at a fourth time after the adjustment in step (d);

(b) calculating a second adjustment to one or both of the retaining ring pressure and CMP head membrane pressure in the at least first and second annular zones in response to a second pre-clearing time difference that will minimize a clearing time difference between the first and second annular regions at an end of the polish cycle; and (c) applying the second adjustment to one or both of the retaining ring pressure and the CMP head membrane pressure in the at least first and second annular zones that is maintained until the end of the polish cycle.

* * * * *